United States Patent [19]

Aldinger

[11] Patent Number: 4,779,040
[45] Date of Patent: Oct. 18, 1988

[54] METHOD AND APPARATUS FOR RECOGNIZING THE POLARITY OF POLARIZED CAPACITORS

[75] Inventor: Ulrich Aldinger, Munich, Fed. Rep. of Germany

[73] Assignee: Siemens Aktiengesellschaft, Berlin & Munich, Fed. Rep. of Germany

[21] Appl. No.: 7,485

[22] Filed: Jan. 28, 1987

[30] Foreign Application Priority Data

Aug. 1, 1986 [DE] Fed. Rep. of Germany ....... 3626037

[51] Int. Cl.$^4$ .................... G01R 27/26; B07C 5/344
[52] U.S. Cl. ........................... 324/61 R; 324/60 C; 324/60 CD; 209/574
[58] Field of Search ............ 324/60 C, 61 R, 60 CD, 324/60 R, 133; 209/574; 307/127

[56] References Cited

U.S. PATENT DOCUMENTS 3,534,853 10/1970 Seaman ............................... 209/574

FOREIGN PATENT DOCUMENTS 3213110 10/1983 Fed. Rep. of Germany .... 324/61 R

OTHER PUBLICATIONS

Roop et al., Reverse Capacitor Tester, IBM Technical Disclosure Bulletin, vol. 26, No. 2, Jul. 1983, pp. 579-581.

Primary Examiner—Reinhard J. Eisenzopf
Assistant Examiner—Jack B. Harvey
Attorney, Agent, or Firm—Hill, Van Santen, Steadman & Simpson

[57] ABSTRACT

For recognizing the polarity of polarized capacitors, their capacitance is measured with an alternating voltage which is superposed with a positive dc voltage and than a negative dc voltage of equal amount. Since a polarized capacitor comprises a lower capacitance given a correct poling than it does given an incorrect poling, the polarization of the capacitor can be indentified from the difference between the two measured capacitances. In particular, the polarity of tantalum or aluminum electrolytic capacitors in the automatic equipping of printed circuitboards or ceramic substrates can be recognized with this method.

11 Claims, 1 Drawing Sheet

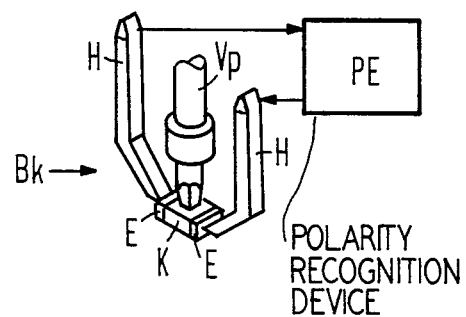
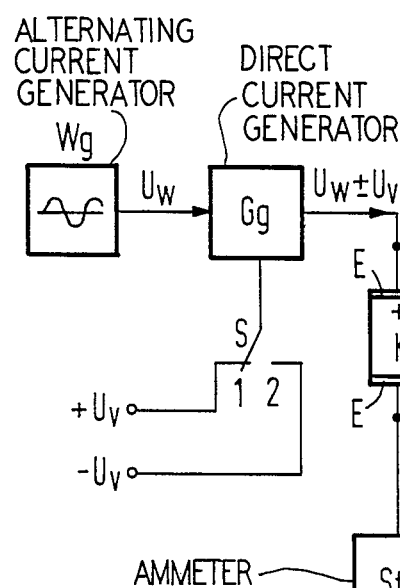
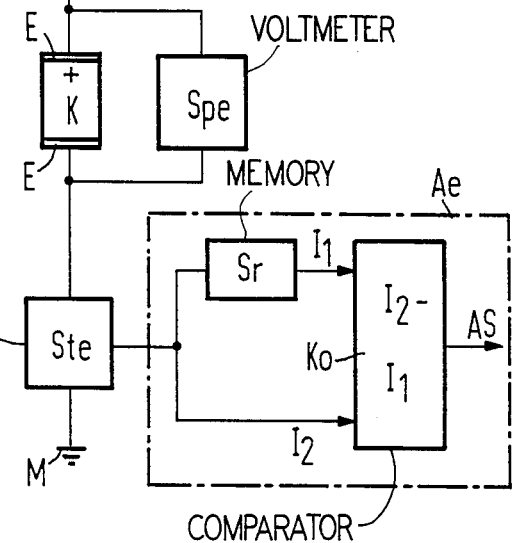

METHOD AND APPARATUS FOR RECOGNIZING THE POLARITY OF POLARIZED CAPACITORS

CROSS REFERENCE TO RELATED APPLICATION

This application is related to application Ser. No. 006,904 filed Jan. 27, 1987.

BACKGROUND OF THE INVENTION

1. Field of the Invention

The present invention relates to a method for recognizing the polarity of polarized capacitors, particularly tantalum and aluminum electrolytic capacitors in automatic equipping of printed circuitboards and ceramic substrates, and is also concerned with an apparatus for implementation of the method.

2. Description of the Prior Art

In automatic equipping of printed circuitboards and ceramic substrates with electronic components such as resistors, capacitors, diodes, transistors, chips and the like, the various components are offered in laterallyarranged feeder devices. The removal of the components then occurs via an equipping head which grasps the respective component offered in a removal position, centers the component with the assistance of four forceps-like levers arranged in pairs, and deposits the component on a predetermined location on the printed circuitboard or of the ceramic substrate. The reliability of equipping obtainable with such automatic equipping units known, for example, from U.S. Pat. No. 4,155,630, fully incorporated herein by this reference, critically depends on the equipping head programmed for the removal position of the feeder devices always encountering the components in the proper position and likewise depositing the component in the proper position in the program equipping position of the printed circuitboard or of the ceramic substrate.

In an equipping head disclosed in the German No. A 3 102 206, at least the lower end of the suction pipette serving the purpose of picking up the components is composed of an electrically non-conductive material, whereby the forceps-shaped ends of the lever interacting with the electronic component are arranged in an electrically insulated manner. As a result of this measure, a defined current can be supplied via a pair of levers or a defined voltage can be applied via a pair of levers. In particular, there is the possibility of measuring or testing the electrical characteristics of the component respectively seized by the equipping head. However, a recognition of the polarity of polarized capacitors that is absolutely necessary for automatic equipping is not possible with the mentioned equipping head since suitable electrical recognition methods have been heretofore unknown.

SUMMARY OF THE INVENTION

The object of the present invention, therefore, is to provide a method for recognizing the polarity of polarized capacitors which, in particular, enables a simple and reliable polarity recognition of tantalum and aluminum electrolytic capacitors in the automatic equipping of printed circuitboards or ceramic substrates.

The above object is achieved, according to the present invention, in that the capacitance of a capacitor to be tested is measured with an alternating voltage which is once superposed with a positive dc voltage and once superposed with a negative dc voltage, and in that the polarization of the capacitor is identified from the difference of the two measured capacitances.

The present invention is based on the perception that a lower capacitance is measured given a correct poling of electrolytic capacitors than is measured given an incorrect poling. This is to be attributed to the fact that the dielectric composed of a metal oxide layer is strengthened by oxygen absorption given a correct poling, whereas it suffers a weakening due to oxygen withdrawal given an incorrect poling. The reduction in the strength of the dielectric then necessarily leads to a higher capacitance. Although the differences between the capacitances are slight given correct and incorrect poling, particularly due to the low voltages allowed, absolutely reliable information concerning the polarity of the measured capacitors can be acquired by comparison of the two measurements.

According to a particular feature of the invention, a sinusoidal alternating voltage having a constant frequency is employed. Such sinusoidal alternating voltages enable particularly simple measurements of capacitances.

Furthermore, it has also been particularly beneficial when an alternating voltage having an amplitude of $\pm 0.25$ volts measured proceeding from zero is employed. This alternating voltage is then preferably superposed with a dc voltage of $\pm 0.25$ volts. Taken into consideration in such dimensioning is, first of all, that the risk of destroying the capacitor already exists at voltages above 0.5 volts, and, secondly, that higher superposed dc voltages lead to clearer differences between the two measured capacitances.

It is provided in accordance with a preferred embodiment of the invention that complex measurements of resistance are provided as measurements of capacitance. In this case, for example, it is then possible that, given a constant alternating voltage, the current with the positive dc voltage is measured once and the current with the negative dc voltage is measured once and that a conclusion regarding the polarization of the capacitor is drawn from the difference between the two measured currents. This simplified measurement is enabled by the selection of the constant alternating voltage with a constant frequency.

Another simplified measurement can be provided in that an impressed constant alternating current is superposed once with a direct current of the one direction and is superposed once with a direct current of the same magnitude and of the opposite direction, in that the assigned voltage is respectively measured parallel to the capacitor, and in that a conclusion regarding the poling of the capacitor is drawn from the difference between the two measured voltages.

Instead of a current measurement given constant voltage or a voltage measurement given constant current, the complex resistance can also be identified from the ratio of the measured voltage to the assigned, measured current. Such measurements are particularly precise since they also take the impedances of the lines into consideration.

An apparatus for implementing the method of the present invention that is particularly reliable and constructed in a particularly simple manner is characterized in that the outputs of an alternating voltage generator and of a dc voltage generator for superposing a positive dc voltage or a negative dc voltage are connectible to the capacitor to be tested, and in that an ammeter device is arranged in series with the capacitor.

More accurate measured results on the basis of taking the line impedances into consideration can be achieved, as warranted, in that a voltmeter device is arranged parallel to the capacitor to be tested. The complex resistance can then be identified from the ratio of the measured voltage to the measured current.

It is provided in accordance with a preferred embodiment of the apparatus of the invention that the ammeter device is followed by an evaluator device. The comparison of the measured capacitance or, respectively, currents required for the analysis can then be achieved in a particularly simple manner in that a memory for a first measured value of the current is arranged in the evaluator device and in that the stored, first measured value of the current and a second measured value of the current can be supplied to a following comparator. The output signal of the comparator can then be supplied, for example, to the computer of an automatic equipping unit so that the polarity recognition can be taken into consideration before the polarized capacitor is deposited into the assigned equipping position, being taken into consideration, as warranted, by a 180° rotation of the equipping head.

BRIEF DESCRIPTION OF THE DRAWING

Other objects, features and advantages of the invention, its organization, construction and mode of operation will be best understood from the following detailed description, taken in conjunction with the accompanying drawing, on which:

FIG. 1 is a partial view of an equipping head having a polarized capacitor and a polarity recognition device; and FIG. 2 is a basic circuit diagram of the polarity recognition device illustrated in FIG. 1.

DESCRIPTION OF THE PREFERRED EMBODIMENTS

FIG. 1 illustrates a capacitor K grasped by the equipping head Bk of an automatic equipping unit. Only a vacuum pipette Vp is illustrated for the equipping head Bk along with two of the total of four levers H provided for centering the grasped components.

The capacitor K illustrated in FIG. 1 is a polarized capacitor constructed as an SMD component, for example, a tantalum electrolytic capacitor. Accordingly, one of the end face electrodes E has the positive pole assigned thereto and the other electrode has the negative pole assigned thereto. Since the polarity of the capacitor indicated by a "+" printed on only one side cannot be recognized by the automatic equipping unit, the equipping head has the polarity recognition device PE assigned thereto. The polarity recognition device is connected to those two levers H whose forcep-like ends contact the electrodes E of the polarized capacitor K picked up by the equipping head Bk.

FIG. 2 illustrates a greatly simplified, schematic illustration of the operating basic structure of the polarity recognition device PE. An alternating current generator WG generates a constant, sinusoidal alternating voltage Uw having a constant frequency of 1 kHz and an amplitude of ±0.25 volts as measured proceeding from zero. In a following direct current generator Gg, either a constant, positive dc voltage $+U_v=0.25$ volts or a constant, negative dc voltage $-U_v=0.25$ volts is generated depending on the position of the switch S and is superimposed on the alternating voltage $U_w$. In the position 1 of the switch S as shown in FIG. 2, therefore, a resulting voltage of $U_w+U_v$ is generated, this changing sinusoidally between a lower value zero and an upper value +0.5 volts and therefore not comprising any negative component. In the position 2 of the switch S, by contrast, a resulting voltage $U_w-U_v$ is generated, this sinusoidal changing between an upper value zero and a lower value −0.5 volt and therefore does not comprise any positive component.

The resulting voltage $U_w+U_v$ or $U_w-U_v$ generated with the alternating current generator Wg and with the direct current generator Gg is applied to one of the electrodes E of the capacitor K. The other electrode E of the capacitor K which, in reality, is contacted in accordance with FIG. 1 is applied to ground M via an ammeter device Ste connected in series with the capacitor. A voltmeter device Spe is arranged parallel to the capacitor K.

The ammeter device Ste is followed by an evaluation device Ae comprising a memory Sr and a comparator Ko. The memory Sr thereby has the job of storing the current I1 measured by the ammeter device Ste in the position 1 of the switch S. By contrast thereto, the current I2 measured by the ammeter device Ste in the position 2 of the switch S is directly supplied to the comparator Ko. The stored current $I_1$ can then be compared to the presently identified current $I_2$ in the comparator Ko, whereby the difference $I_2-I_1$ forms an output signal AS that is representative of the polarity of the respective capacitor K, the signal AS, for example, being supplied to the computer of the automatic equipping unit.

The capacitances of the capacitor K in the positions 1 and 2 of the switch S are measured with the device set forth above. These capacitance measurements, however, are carried out indirectly via complex resistance measurements in accordance with the equation $$R=1/(i\cdot\omega\cdot C)$$

wherein R represents the alternating current resistance, i represents the imaginary unit $\sqrt{-1}$, $\omega$ represents the frequency of the alternating voltage $U_w$ in radians and C represents the capacitance of the capacitor K. On the other hand, the relationship $$R=U/I$$

also holds true, whereby $U=U_w+U_v$ or $U=U_w-U_v$ represents the voltage applied to the capacitor K and $I=I_1$ or $I=I_2$ represents the current measured with the ammeter device Ste. Accordingly, the current I and the capacitance C are proportional quantities given a constant voltage U and given a constant radiant frequency $\omega$.

Based on the perception that the measured capacitance in electrolytic capacitors is lower given correct poling than given incorrect poling, it derives for the case illustrated in FIG. 2 that a correct poling can be assumed given $I_1<I_2$, whereas $I_1>I_2$ indicates an incorrect poling of the capacitor K.

In accordance with FIG. 2, the upper electrode E of the capacitor K is labeled "+" which cannot be recognized by the automatic equipping unit for identification of the polarity. However, the automatic equipping unit is informed of the correct polarity on the basis of the output signal $AS=I_2-I_1$. In the illustrated case, $I_1<I_2$ applies, i.e. the positive value of the output signal AS indicates that the capacitor K exhibits the correct polarity with the smaller capacitance in the position 1 of the switch S. Since a positive voltage $U_w + U_v$ is applied to the upper electrode E of the capacitor K in FIG. 1 in position 1 of the switch S, what occurs is that the upper electrode E is assigned to the positive pole and the lower electrode E is assigned to the negative pole.

If the capacitor K in FIG. 2 were to assume a position rotated by 180°, then a negative value of the output signal AS would indicate that the lower electrode E is now assigned to the positive pole. In this case, the equipping head Bk (cf. FIG. 1) executes a 180° rotation before depositing the capacitor K in the equipping position.

Measurements carried out with the above-described polarity recognition device PE at tantalum electrolytic capacitors always yielded capacitance values lower by about 0.15% given correct poling than given incorrect poling. It was also taken into consideration in the above-described polarization recognition device PE that a maximum pole-reversing voltage of 0.15 $U_{Nenn}$ at 20° C. and of 0.05 $U_{Nenn}$ at 80° C. should not be exceeded for tantalum electrolytic capacitors and that a maximum pole-reversing voltage of 2 volts should not be exceeded given aluminum electrolytic capacitors.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A method for recognizing the polarity of a polarized capacitor, comprising the steps of: superposing a first dc voltage on an alternating voltage
    to produce a first charging signal;
    applying the first charging signal to the capacitor;
    measuring the capacitance of the capacitor as charged by the first charging signal;
    superposing a second dc voltage, equal in amplitude to and of opposite polarity with respect to the first dc voltage, on the alternating voltage to produce a second charging signal;
    applying the second charging signal to the capacitor;
    measuring the capacitance of the capacitor as charged by the second charging signal; and
    comparing the measured capacitances and identifying the correct polarization of the capacitor as represented by the smaller capacitance.

2. The method of claim 1, and further comprising the step of:
    generating the alternating voltage as a sinusoidal alternating voltage having a constant frequency.

3. The method of claim 2, wherein the step of generating the alternating voltage is further defined as:
    generating the alternating voltage with an amplitude of ±0.25 volts with respect to zero.

4. The method of claim 3, wherein the steps of superposing the first dc voltage and the second dc voltage on the alternating voltage is further defined as:
    generating a dc voltage having an amplitude of ±0.25 volts.

5. The method of claim 1, wherein the steps of measuring the capacitances are further defined as:
    applying complex resistance measurements as capacitance measurements.

6. The method of claim 5, wherein the step of applying complex resistance measurements is further defined as:
    sensing the charging current created by the first charging signal;
    sensing the charging current created by the second charging signal; and
    generating a signal representing the polarization from the difference between the two measured currents.

7. The method of claim 5, wherein the step of applying complex resistance measurements is further defined as:
    measuring the voltage across the capacitor in a charged state;
    measuring the charging current of the capacitor; and
    determining the capacitance from the ratio of the measured voltage to the measured current.

8. The method of claim 1, wherein the step of comparing the measured capacitances is further defined as:
    measuring the voltage across the capacitor as charged by the first charging signal;
    measuring the voltage across the capacitor as charged by the second charging signal; and
    comparing the two measured voltages to determine the correct polarization.

9. Apparatus for recognizing the polarity of a polarized capacitor, comprising:
    an alternating voltage generator for producing an alternating voltage;
    superposition means including a direct voltage generator connected to said alternating generator and connectible to the capacitor, said superposition means selectively operable to superpose a first dc voltage of a first polarity on the alternating voltage to charge the capacitor in a first direction and to superpose a second dc voltage of a second polarity and equal amplitude to the first dc voltage on the alternating voltage to charge the capacitor in a second direction;
    current measuring means connected in series with the capacitor for measuring the charging current for each charging of the capacitor; and
    comparison means for comparing the charging currents and producing a signal representing the polarity of the capacitor.

10. The apparatus of claim 9, and further comprising:
    voltage measuring means for connection in parallel with the capacitor for measuring the voltages of the capacitor as charged in both directions to determine the polarity.

11. The apparatus of claim 9, wherein said comparison means comprises:
    storage means for storing the measured value of the first charging current; and
    a comparator connected to said current measuring means and to said storage means for comparing the stored measured value of the first current to the second measured current.

* * * * *